PROCESS FOR REMOVING SHORTS FROM P-N JUNCTIONS

Filed Dec. 24, 1957

INVENTOR
ROBERT S. SCOTT

BY Lester W. Clark
ATTORNEY 2,963,411

PROCESS FOR REMOVING SHORTS FROM P-N JUNCTIONS

Robert S. Scott, Wappingers Falls, N.Y., assignor to International Business Machines Corporation, New York, N.Y., a corporation of New York Filed Dec. 24, 1957, Ser. No. 704,917

1 Claim. (Cl. 204—143)

This invention relates to a process and apparatus for salvaging junction type semi-conductive devices which are defective in that some surface structure is electrically short-circuiting a P-N junction.

A junction type semi-conductive device comprises a monocrystalline body of a matrix material, e.g., germanium, usually having a valence of four and whose electrical conductivity is intermediate the conductivities of conductors and insulators. In one region of the monocrystalline body, there is a small proportion of an impurity material, e.g., antimony or arsenic, having a valence of five. This impurity creates imperfections in the crystal lattice, each imperfection being characterized by a free electron. Such an impurity is called a "donor" (it donates free electrons), and a region of the monocrystalline body where such an impurity is preponderant over other impurities is termed an N-region (conductivity is by free electrons, i.e., negative charges). In another region of the monocrystalline body, adjacent the N-region, there is a small proportion of an impurity material, e.g., indium, having a valence of three. This impurity creates in the crystal lattice imperfections characterized by the absence of an electron, and termed "holes." These "holes" can move through the crystal lattice and appear as a moving positive charge. Such an impurity is called an "acceptor" material (it accepts free electrons) and a region of the monocrystalline body where such an impurity is preponderant is called a P-region (conductivity is by "holes," i.e., positive charges).

The interface between the P and N regions is called a boundary junction, or simply a junction. Such an interface exhibits properties of asymmetrical electrical conductivity, i.e., its conductivity is higher in one direction of current flow than in the other.

A diode comprises a single P-N junction. A transistor comprises more than two regions of differing conductivity types. Typically, a transistor has three regions, arranged either PNP or NPN.

The process is described herein as applied to transistors, although it is obviously usable with other semi-conductive devices, e.g., diodes.

One well-known method of manufacturing transistors is known as the alloy junction process. In that process, a main body of semi-conductive material, e.g., germanium, is alloyed at an interface with a smaller body of donor or acceptor material, usually indium, antimony, or the like. A P-N junction is formed at the interface between the two materials. Another known method of manufacturing transistors is called the grown junction method. In the latter method, a crystal is formed from molten germanium by slowly withdrawing a seed crystal from the melt. Various techniques are employed to change the composition of the grown crystal in such a way that it consists partly of N-type material and partly of P-type material. A P-N junction is formed at the interface between the two types of materials.

In either of these manufacturing processes, a certain percentage of the resulting transistors have junctions which do not possess the required asymmetrically conductive characteristics, but rather show evidence of the presence of an electrical short-circuit across the junction. It has now been discovered that in many cases these short-circuits are due to surface structures too small to be readily visible. In such cases, the short-circuit conditions may be removed by the process and apparatus described below.

An object of the invention is to provide a process for salvaging junction-type semi-conductive devices having surface short-circuits.

Another object is to provide such a process for removing the short-circuits without unduly weakening the underlying bodies.

Another object is to provide a process of the type described which is amenable to use in mass production.

Another object is to provide improved apparatus for use in carrying out the process described.

The foregoing and other objects of the invention are attained by the process and apparatus described herein. In that process, a junction-type semi-conductive device is immersed in a solution of an acid electrolyte, preferably sulphuric acid, and at the same time the two regions on the opposite sides of the semi-conductive junction in the body are connected in an electrical circuit with a source of direct current so poled that the junction is reversely biased. The semi-conductive device is allowed to remain so connected and so immersed for a brief period of time, during which period the electrolyte selectively etches or erodes the N-type material, thereby defining the junction clearly at the surface of the semi-conductive body and weakening any surface structure which crosses the junction. The electrical circuit is then disconnected and a new electrical circuit is established with the source of direct current having its positive terminal connected to the N region of the semi-conductive body and its negative terminal connected to an electrode immersed in the electrolyte, but spaced from the semi-conductive device. This second electrical connection and immersion is continued for another brief period of time. During this latter period, the acid electrolyte is effective to attack and remove the short-circuiting structures which were exposed during the first step of the process.

Other objects and advantages of the invention will become apparent from the consideration of the following description and claim, taken together with the accompanying drawing.

Figure 1:
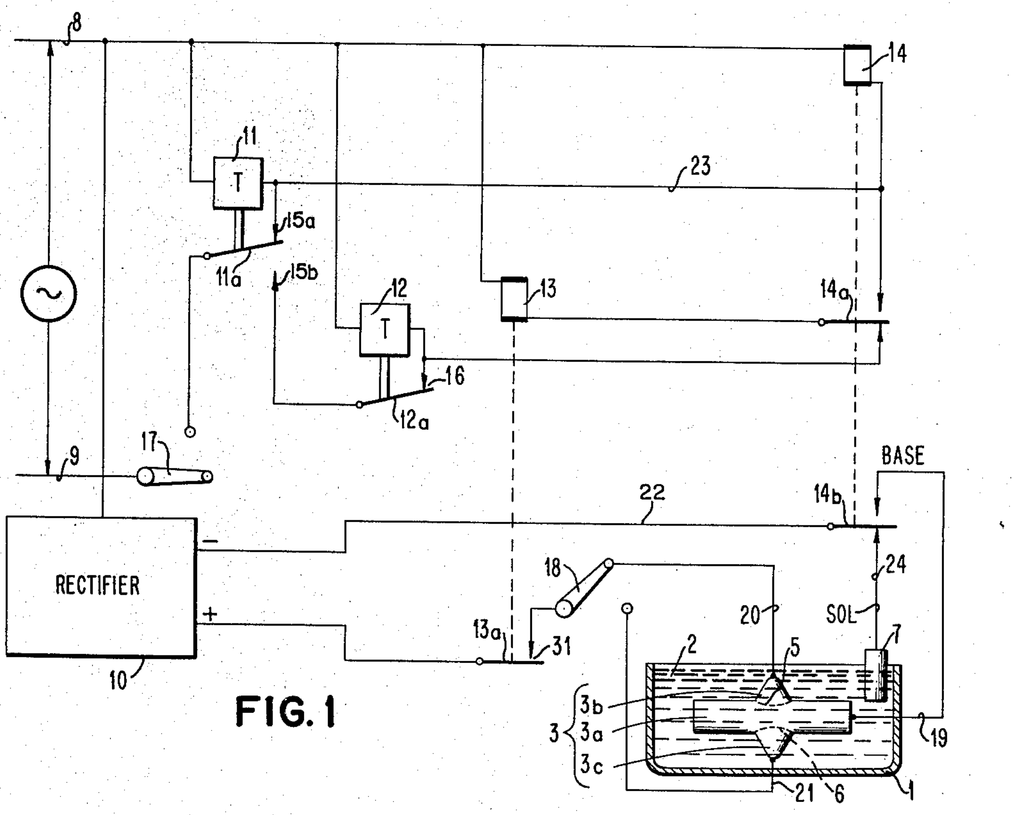
Fig. 1 is an electrical wiring diagram of an apparatus for carrying out the process according to the invention.

Referring to Fig. 1, there is shown a tank 1 containing an electrolyte 2. The electrolyte is preferably about a 10% solution of sulphuric acid. In the solution, a transistor 3 is supported, usually by hanging it from its connecting wires. The transistor 3 illustrated is an NPN transistor which has been formed by the alloy junction method and comprises a central body or die *3a* of germanium and upper and lower bodies or dots *3b* and *3c*. For convenience in fabrication of the transistor the dots *3b* and *3c* may be formed of an alloy of donor material, e.g., arsenic or antimony, and a carrier material, e.g., lead, having a substantially lower melting point than the donor material. The range of proportions in such alloys is not critical, and varies widely. The body *3a*, which serves as the P-region of the transistor is separated from the N-region *3b* by a junction 5, and from the N-region 3c by a junction 6. An electrode 7 is supported in any convenient manner (not shown), and is at least partly immersed in the electrolyte.

Electric power is taken from a conventional 110-volt A.C. power supply through lines 8 and 9, and is rectified by a conventional rectifier 10 to provide direct current for the electrolytic process. The timing of the two steps of the process is controlled by two timers 11 and 12, of any suitable conventional structure, which in turn control a pair of relays 13 and 14.

The timer 11 controls a contact 11*a*, which engages a stationary contact 15*a* when the timer 11 is deenergized. At a preset time after the energization of timer 11, it moves contact 11*a* from engagement with contact 14 into engagement with another contact 15*b*.

The timer 12 similarly controls movable contact 12*a*. When timer 12 is deenergized, contact 12*a* engages a stationary contact 16. At a preset time after timer 12 is energized, it separates the contact 12*a* from the contact 16.

Relay 13 operates a single contact 13*a*, which is opened when the relay is deenergized and closed against a front contact 31 when the relay is energized.

Relay 14 controls contacts 14*a* and 14*b*. Both these contacts engage cooperating back contacts when the relay winding is deenergized and move to engage front contacts when the relay winding is energized.

A master switch 17 controls the energization of the timer circuits. A double-throw selector switch 18 determines which of the junctions 5 and 6 is treated on any particular cycle of operation of the process.

*Operation*

The timer 11 is first set for the desired time of duration for the first step of the process, and the timer 12 is set for the period of operation of the second step. An electrical connection is made between the P-region 3*a* and a wire 19, by any suitable method, e.g., soldering. Other connections are made between the N-regions 3*b* and 3*c* and wires 20 and 21, respectively.

The selector switch 18 is set for one or the other of the junctions 5 and 6. In the present instance, the junction 5 is selected.

The transistor 3 is then immersed in the electrolyte, as shown, and the master switch 17 is closed to start the timing of the process. Closing of the switch 17 completes an energizing circuit for timer 11 which can be traced from line 8 through timer 11, contacts 15*a* and 11*a* and switch 17 to line 9.

A circuit is established at the same time for energizing the winding of relay 14. This circuit may be traced from line 8 through the winding of relay 14, and thence through wire 23, contacts 15*a* and 11*a* and switch 17 to line 9.

When the winding of relay 14 is energized, its contact 14*a* engages its associated front contact thereby completing an energizing circuit for relay 13, which closes its contact 13*a*, completing a connection between the positive terminal of rectifier 10 and the N-region 3*b*. Contact 14*b* engages its associated front contact, completing a connection between the negative terminal of rectifier 10 and the P-region 3*a*.

A complete circuit may be traced from the positive terminal of rectifier 10 through contact 13*a*, switch 18, wire 20, N-region 3*b*, junction 5, P-region 3*a*, wire 19, contact 14*b* and wire 22 to the negative terminal of rectifier 10.

During this phase of the process, which is hereinafter referred to as the first step, the principal resistance in the electrical circuit is encountered at the reversely biased asymmetrically conductive junction 5. The electrolyte 2 forms a shunt path around that junction. At the surface of the N-region 3*b* adjacent the junction, electrolytic erosion occurs. While, because of the small dimensions involved, it is not completely certain as to just what action takes place, it is believed that the action involved is erosion such as takes place at the anode in typical electrolytic processes. This erosion of the N-region 3*b* adjacent the junction serves to clearly define the junction and exposes any small structures which may be extending across and short-circuiting the junction.

This circuit is maintained until timer 11 operates to move its contact 11*a* away from stationary contact 14 and into engagement with contact 15. Separation of contact 11*a* from contact 15*a* opens the circuits previously established for energizing timer 11, relay winding 13 and relay winding 14, and completes new circuits for energizing timer 12 and the winding of relay 13. The winding of relay 13 is momentarily deenergized. During the time it is deenergized, the contact 14*b* of relay 14 switches from its front to its back contact, thereby sending the electrolytic current through the electrode 7 rather than through the P region 3*a*.

The new circuit for energizing relay 13 may be traced from line 8 through the winding of relay 13, contact 14*a*, contacts 16 and 12*a*, contact 15*b*, contact 11*a* and switch 17 to line 9. When the contact 13*a* closes again, the electrolytic circuit may be traced from the positive terminal of rectifier 10 through contact 13*a*, switch 18, wire 20, N-region 3*b*, the electrolyte 2, the electrode 7, a wire 24, contact 14*b*, and wire 22 back to the negative terminal of rectifier 10. This circuit is maintained for a time depending upon the setting of the timer 12, usually about ten seconds.

This phase of the process is hereinafter referred to as the second step. Again, the exact nature of the electrolytic process that is going on is not certain. However, it is believed that typical electrolytic erosion of the anode is involved. Both the N-region 3*b* and the P-region 3*a* are now anodes, but the P-region 3*a* only acts appreciably as an anode as long as a short circuit path exists across the junction 5. Any structures which remain crossing and short-circuiting the junction 5 are subjected to a particularly high current density, since they provide a short across the high impedance junction. Such structures being very small, must necessarily be subject to high current densities. They are thereby quickly eroded by the electrolyte, and indeed preferentially eroded as compared to the other parts of the transistor 3.

When timer 12 opens its contact 12*a*, the circuit for energizing relay 13 is interrupted, thereby opening the electrolytic circuit at the contact 13*a*.

Figure 2:
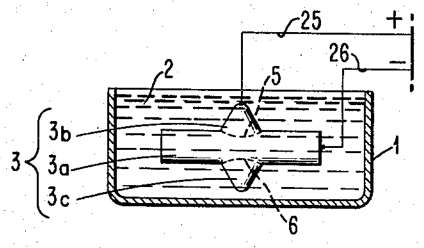
Fig. 2 is a diagrammatical illustration of the first step of the process.
Figure 3:
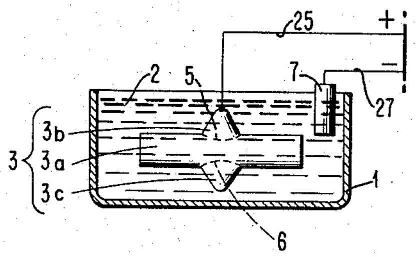
Fig. 3 is a diagrammatical illustration of the second step of the process.

Instead of having the two steps of the process mechanically timed as illustrated in Fig. 1, the steps may be manually carried out as illustrated in Figs. 2 and 3. In these figures, those parts which correspond to their counterparts in Fig. 1 have been given the same reference numerals and will not be further described.

In Fig. 2, the N-region 3*b* is connected by means of a wire 25 to the positive terminal of a direct current source, and the P-region 3*a* is connected through a wire 26 to the negative terminal of that source. The junction 5 is thereby reversely biased. This condition is maintained for a time necessary to etch preferentially the N-type material in the immediate neighborhood of the junction 5, so as to define that junction on the surface of the semi-conductive body.

The electric circuit arrangement is then changed to that shown in Fig. 3, wherein the P-region 3*a* is electrically disconnected and the negative terminal of the direct current source is connected through a wire 27 to the electrode 7.

The etching times for the two steps of the process may be varied considerably from the example given above. For each step of the process, times between four seconds and sixteen seconds have been successfully used. Below four seconds the results are variable, being sometimes successful in removing short-circuits and sometimes unsuccessful. Above sixteen seconds, the germanium wafers of the dimensions commonly used for transistors become too thin and thereby are made mechanically weak. It should be observed however that the amount of material removed by etching is a function of the current density. A suitable value of current density depends upon the geometry and dimensions of the particular semi-conductive device being etched. Because of the small dimensions and irregular current paths employed on these devices, it is not possible to measure the current density accurately in conventional terms, i.e., as amperes per square inch. Other semi-conductive structures than the ones described in the illustrated examples might tolerate considerably longer etching times for a particular given value of current.

Electrolyte concentration is not critical. There should be sufficient concentration to carry the current, but insufficient to produce uncontrolled chemical etching. Experimental concentrations as low as one-half of one percent have been used, although results are not uniformly satisfactory at that low value. The maximum upper limit is approximately 30 to 40%.

The value of current supplied for a particular semi-conductive device determines etching rate for that particular transistor geometry and dimensions. For a transistor junction between a die of germanium .064" long, .064" wide, and .003" thick, and a dot of lead arsenic alloy whose original cylindrical dimensions were 0.010"–0.015" diameter by 0.010" high, satisfactory etching may be obtained within the range from about 100 to 1000 milliamperes.

While sulphuric acid is greatly preferred for the etching solution, other acid etching solutions may be satisfactory. Hydrochloric acid and nitric acid have been successfully used. Of course, the acid selected must be chemically compatible with the particular materials used in the semi-conductive device. Concentration, times and currents may have to be changed with a change in the acid.

A change in the geometry or dimensions of the semi-conductive device may require a change in the time and current values employed, and may affect the maximum concentration.

The process has been disclosed in connection with an N–P–N transistor. It is also applicable to a P–N–P transistor. When so applied, the N-region must be the anode in the first step. In the second step, the polarity must be reversed to make the P-region the anode.

The terms "etch" and "etching" as used herein, are intended to be broad enough to include electrolytic processes such as those described.

The theories expressed herein are intended only as theoretical explanations of the mode of operation of the invention, and the invention is not limited by those theories.

While I have shown and described certain preferred embodiments of my invention, other modifications thereof will readily occur to those skilled in the art, and I therefore intend my invention to be limited only by the appended claim.

I claim:

The process of removing a surface short at a P–N junction in a semi-conductive device, comprising the steps of connecting the P-region of the device to the negative terminal and the N-region to the positive terminal of a source of unidirectional electrical energy, immersing the device in an etchant solution of about 10% sulfuric acid, maintaining the device immersed with a current flowing through it from said source for a time between 4 and 16 seconds and with a current density sufficient to etch selectively the N-region at a locality adjacent the P–N junction, thereby defining the junction and exposing any surface structure which is shorting it; thereafter disconnecting the negative terminal of the source from the P-region and connecting the said negative terminal to an electrode spaced from the device and at least partly immersed in the same etchant solution, and maintaining a current flow through said N-region and the etchant solution for a time between 4 and 16 seconds and with a current density sufficient to etch away any shorting surface structure.

References Cited in the file of this patent

UNITED STATES PATENTS

| | | |
|---|---|---|
| 2,320,495 | Waterman | June 1, 1943 |
| 2,564,823 | Wallace | Aug. 21, 1951 |
| 2,656,496 | Sparks | Oct. 20, 1953 |
| 2,695,930 | Wallace | Nov. 30, 1954 |
| 2,783,197 | Herbert | Feb. 26, 1957 |
| 2,799,637 | Williams | July 16, 1957 |
| 2,802,159 | Stump | Aug. 6, 1957 |